United States Patent [19]

Go

[11] 4,242,980
[45] Jan. 6, 1981

[54] DISPLAYING MEASURING INSTRUMENT

[75] Inventor: Thiam L. Go, The Hague, Netherlands

[73] Assignee: Friedrich Wilhelm Zube, Nidda, Fed. Rep. of Germany

[21] Appl. No.: 876,699

[22] Filed: Feb. 10, 1978

[51] Int. Cl.³ .............................. G08B 5/36; G09F 9/00
[52] U.S. Cl. .................................. 116/202; 324/57 R; 340/715; 340/753
[58] Field of Search ................ 324/57 R; 340/378 R, 340/336, 166 EL, 324 A, 753, 754; 116/202

[56] References Cited

U.S. PATENT DOCUMENTS

| | | | |
|---|---|---|---|
| 3,257,652 | 6/1966 | Foster | 340/324 R X |
| 3,343,155 | 9/1967 | Pahlavan | 340/324 |
| 3,460,127 | 8/1969 | Pahlavan | 340/324 |
| 3,525,091 | 8/1970 | Lally | 340/324 R |
| 3,543,148 | 11/1970 | Martin | 340/378 R X |
| 3,725,901 | 4/1973 | Lehaki et al. | 340/324 A |
| 3,914,758 | 10/1975 | Ingle | 340/753 X |
| 4,024,767 | 5/1977 | Kamf | 116/136.5 X |
| 4,039,956 | 8/1977 | Shimanek et al. | 340/753 X |
| 4,077,032 | 2/1978 | Volkmann | 340/378 R X |
| 4,097,857 | 6/1978 | Miyakawa | 340/753 |
| 4,121,204 | 10/1978 | Welsh et al. | 340/753 X |

FOREIGN PATENT DOCUMENTS

| | | | |
|---|---|---|---|
| 1623873 | 10/1970 | Fed. Rep. of Germany | 340/324 |
| 2228275 | 1/1973 | Fed. Rep. of Germany | 340/324 |
| 2000523 | 1/1969 | France | 340/324 |

*Primary Examiner*—Daniel M. Yasich
*Attorney, Agent, or Firm*—Marvin H. Kleinberg

[57] ABSTRACT

A displaying measuring instrument with combined digital and analog display. The lowest order digit of the measuring value to be displayed is indicated by means of a linear scale made up of scale marks, the mark corresponding to the instantaneous value of the measuring value differing in appearance from the surrounding, thus indicating the instantaneous value of the lowest order digit. The higher order digits of the measuring value are displayed by conventional numeral indicators located at the lower end of the linear scale. Thus, the higher order digits are displayed strictly digitally, whereas the lowest order digit is displayed both digitally (by the particular scale mark concerned) and analogously (by the location along the scale of that particular scale mark).

3 Claims, 2 Drawing Figures

DISPLAYING MEASURING INSTRUMENT

BACKGROUND OF THE INVENTION

The invention relates to a displaying measuring instrument with a digital measuring circuit for the magnitude to be displayed, in which the display of the value of that magnity is obtained by selective change of appearance of certain visual display elements of a display panel.

Traditionally, measuring instruments have for a long time been designed as pointer instruments. In such instruments, the magnitude to be measured is applied to a drive means such as a moving coil, which positions the pointer along a calibrated scale in correspondence with the value of the quantity to be measured. Such pointer instruments have the advantage that an approximate impression of the measuring value can be obtained at a glance, and that any change with time of the measuring value can be followed easily. In case of the occurrence of rapid fluctuations of the measuring value too, a good indication of the mean value can be obtained and, provided that the fluctuations are not too fast in comparison to the inertia of the measuring instrument, it is also possible to obtain a rough impression of the presence and magnitude of such fluctuations. A further advantage is the absence of active components in as far as no extreme sensitivity is required. However, disadvantages are the sensitivity for mechanical defects, the small accuracy of the measuring instrument itself, the need for a very careful reading, in which it is always necessary to make an estimate of the precise position of the pointer with respect to the scale, and the very limited possibility of reading fluctuations of the measuring value.

Later, measuring instruments with digital read-out have been developed, in which the value of the measuring quantity is displayed directly in numerals. Advantages thereof are that the accuracy of the measuring instrument can be increased almost indefinitely, that no estimate is necessary for reading the measuring instrument, that the measuring instrument is comparatively insensitive to mechanical defects and that by a combination of standard units, any desired measuring function and measuring range can be obtained. Also, it is possible without difficulties, to obtain an indication of the polarity of the measuring quantity and of any exceeding of the range. However, disadvantages are that the reading becomes virtually impossible for rapidly fluctuating measuring values, since one or more display numerals will change rapidly in that case, whereby these numerals can be read hardly or not at all. Also, it is difficult to obtain an impression of the course of a slowly changing measuring value, since the speed with which and the direction in which the measuring value changes, can be derived only from the time which passes between the changes of the displayed numerals and the sense in which these numerals change respectively. For fluctuating measuring values it is virtually impossible, to read the range within which the measuring value fluctuates.

Because of these advantages and disadvantages, both kinds of measuring instruments found an application area of their own. Since the circumstances in which a measuring instrument will be used cannot always be predicted with any certainty, measuring instruments of either type are often used in circumstances in which the disadvantages inherent to the type of measuring instrument concerned are of great practical importance.

SUMMARY

The invention aims at providing a measuring instrument which to a large extent combines the advantages of both types of measuring instruments referred to, and also to a large extent lacks the disadvantage of both types of measuring instruments referred to.

A measuring instrument according to the invention is characterized in that the display elements of the display panel are so arranged in a straight row, that they succesively change in appearance with rising or falling measuring quantities, and each represents the same increment of the measuring quantity.

DESCRIPTION OF THE PREFERRED EMBODIMENT

Figure 1:
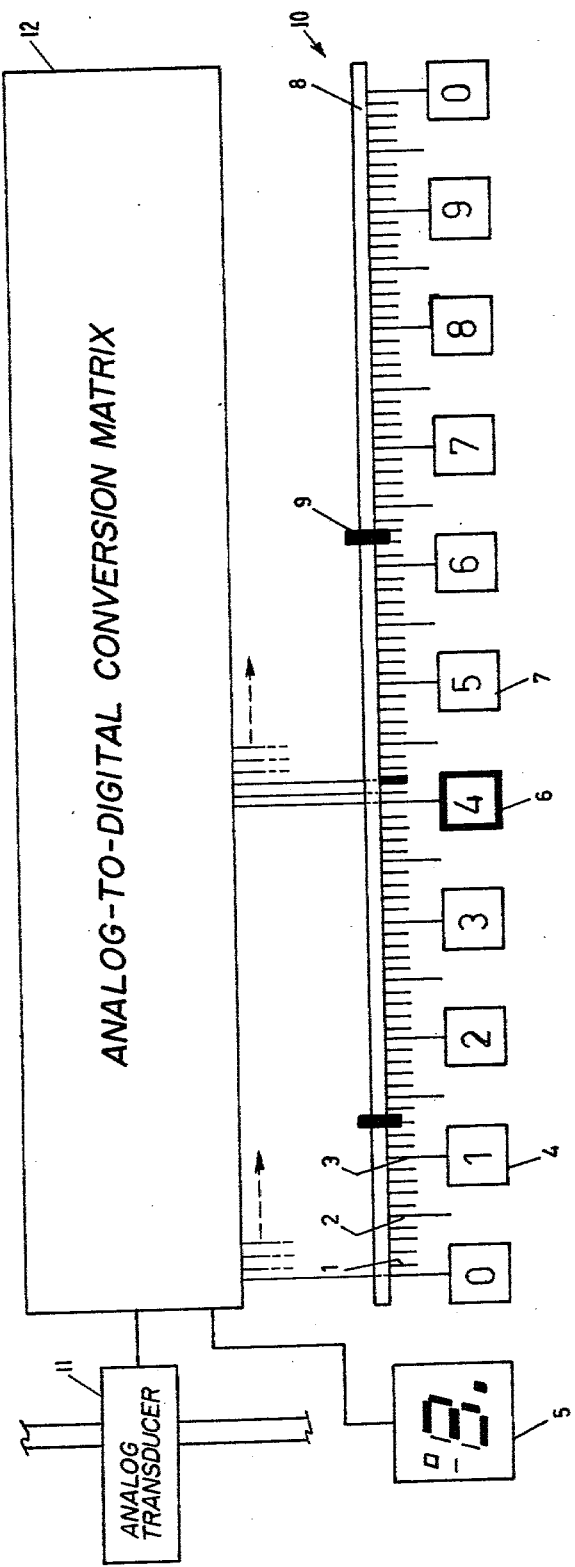
FIG. 1 shows a front view of a display panel of a measuring instrument according to the invention.

The visual display elements can correspond to the scale divisions of the calibrated scale which is conventional for a pointer instrument, and they can emit light upon energization, e.g. by means of light emitting diodes, gas discharge lamps or incandescent lamps, or they can change their reflection coefficient or transmission coefficient upon energization, e.g. by means of liquid crystals. The measuring instrument can be designed in such a way that for each measuring value, only a single display element, corresponding to that measuring value, displays a deviant appearance (point scale, in which the display element with deviant appearance corresponds to the tip of a pointer) or can be made in such a way that all display elements relating to values below the instantaneous measuring value have a first appearance, and all display elements belonging to values above the instantaneous measuring value have a second appearance (rod scale, corresponding to the presentation obtained by a mercury thermometer). The numerals of higher order of the measuring value, for which the disadvantages of digital measuring instruments are less important, as well as an indication for the polarity and/or exceeding of the range, can be displayed conveniently in the way which is usual for digital measuring instruments. The symbols used for that purpose are preferably arranged adjacent the low end of the scale constituted by the visual display elements of the row. A measuring instrument according to the invention is eminently suited for obtaining an adjustable limit value signalling by using one or more movable tabs which can be displayed along the row of visual display elements, carrying light sensitive elements which respond to the changes in the appearance of the display elements.

The invention is further elucidated below with reference to the drawing FIG. 1, which shows a front view of the display panel 10 of a measuring instrument according to the invention.

The scale of the measuring instrument comprises a row of display elements 1, the appearance of which depends upon the electric control. The display elements 1 can e.g. operate with light emitting diodes, gas discharge lamps or incandescent lamps, in whih case they light up upon electric energization, or they can consist of liquid crystals, the optical transmission coefficient or reflection coefficient of which changes dependent upon the electric control, in which case they visually deviate from the surrounding. By way of example, it is here assumed that the display elements 1 operate with light emitting diodes.

Each fifth display element 2 has a greater length than the remaining display elements 1, for marking multiples of five. For the remainder, the display elements 2 operate in the same way as the display elements 1. Each tenth display element 3 not only is longer than the display elements 1, for marking multiples of ten, but also cooperates with its own numeral indicator 4 which makes visible the sequential number of the multiple of ten concerned. For the remainder, the display elements 3 operate in the same way as the display elements 1 and 2.

The individual display elements 1, 2, 3, 4 have their illuminating element, such as a light-emitting diode (LED) activated or changed to the illuminated state by appropriately decoded signals from the analog-to-digital conversion matrix 12. The matrix 12 is driven by analog voltage signals developed, for example, by an analog transducer 11 transducing the quantity to be measured into an analog voltage signal. Similarly, the alphanumeric indication 5, to include the polarrity marks and the decimal, can be driven by matrix 12, which may comprise a circuit shown in FIG. 2.

Figure 2:
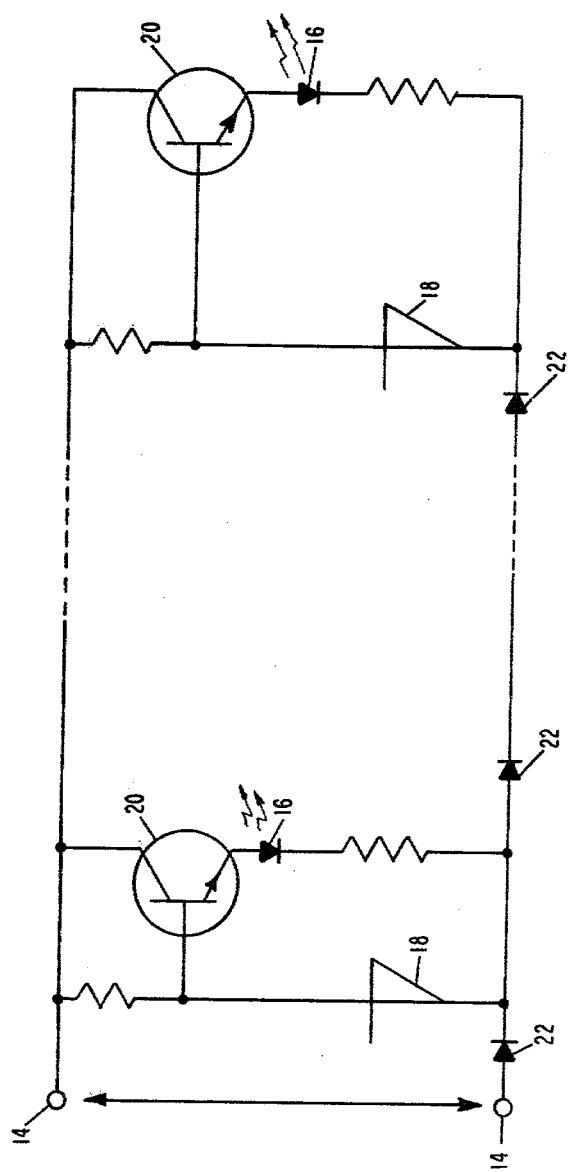
FIG. 2 is schematic of an electric circuit of the prior art for controlling the display panel of the invention.

In FIG. 2, an analog-to-digital voltage scanning circuit is shown for receiving an analog voltage input resulting from some dynamic quantity to be measured. The analog voltage is received at input gates 14. Such an analog voltage scanning circuit is well known by those skilled in the art, the circuit shown in FIG. 2 having been published long prior to the filing of the present application and therefore is labeled in the drawing as PRIOR ART. See, for example, the "Guidebook of Electronic Circuits" by John Markus, Library of Congress, 1974, which describes and shows the newly added FIG. 2 at page 1005. The present circuit is shown merely as an illustrative example of a circuit receiving an analog voltage input for the purpose of driving LEDs in proportional response to the voltage input.

Each LED 16 is driven in a circuit segment 17 comprising silicon unilateral switches 18 in the biasing circuit for transistor switches 20, comprising emitter-type transistors.

The silicon unilateral switches 18 require a relatively high and predetermined voltage to trigger, on the order of 8 volts, but only a relatively small voltage, on the order of 1 volt, to stay on. Zener diodes 22 establish the voltage level sent by each segment 17 so that progressively, from the analog voltage input 14, next succeeding LEDs 16 are driven from dark to an illuminated state. If the LEDs 16 are placed at the location of the display elements 1 in FIG. 1, it can be seen that the display elements 1 are electrically energized to present an illuminated digit upon the receipt of a particular analog voltage at the voltage input 14.

Any number of different Zener diodes 22 can be arranged in the linear array to correspond with the measured levels indicated by the display elements 1, 2 and 3 of FIG. 1. A series of LEDs 16 can be combined in series in selected ones of segments 17 of FIG. 2 to illuminate, for example, each fifth display element 2. An entire series of serially connected LEDs 16 can be arranged in a selected segment 17 of FIG. 2 to result in the illumination of the border of the numeral indicators 4, if desired. The Zener diode 22 can be selected so that as the voltage received at input 14 changes or fluxuates, only one LED driving segment is actuated.

To the left of the scale constituted by the display elements 1, 2 and 3, which towards the right shows increasing numbers, a numeral indicator 5 is arranged, which by way of example has been shown as a numeral indicator for numerals made up of seven segments. This numeral indicator 5 also contains a decimal point to the right of the numeral segments, a minus sign to the left of the numeral segments, and a range overload indication above it. The seven numeral segments, the decimal point, the minus sign, and the range overload indication can again be equipped with light emitting diodes, gas discharge lamps, incandescent lamps or liquid cyrstals.

The numerical indicator 5 may also be driven by the circuit as shown in FIG. 2 or by any other of numerous well-known circuits for driving LEDs, incandescent lamps or liquid crystal displays (LEDs). One such numerical display driving circuit is shown in *Electronics* magazine, Vol. 38, No. 6, at pp. 78–82, March 1965. If desired, several numeral indicators 5 can be arranged side by side, for indicating more than one numeral.

In the shown embodiment it has been assumed that the instantaneous measuring value equals 3.42, that the polarity is positive, and that no range overload has occurred. Consequently, the numeral segments which have been shown bold have an appearance deviating from the surrounding, indicating the numeral 3 of the measuring value, the decimal point which has been shown bold as an appearance deviating from the surrounding, which obviously indicates the decimal point, the mark 6 has an appearance deviating from the surrounding, indicating the numeral 4 of the measuring value, and the second display element 1 to the right of it has an appearance differing from the surrounding, indicating the numeral 2 of the measuring value.

If the measuring value slowly increases, the second display element 1 to the right of the mark 6 resumes its initial condition, not deviating from the surrounding, and in its place, the third element 1 to the right of the mark 6 assumes an appearance deviating from the surrounding etc. As soon as the measuring value reaches 3.50, the mark 6 resumes its initial condition, not deviating from the surrounding, and the mark 7 which indicates a 5, assumes an appearance differing from the surrounding. For a decreasing measuring value, this process occurs in the reverse sense.

The control of the numeral segments of the numeral indicator 5, and of the decimal point, the minus sign, and the range overload indicator thereof, occur in the conventional way.

In the above it has been assumed that at any time only a single display element 1, 2 or 3 has an appearance differing from the surrounding. The mark concerned thereby resembles the tip of the pointer of a pointer instrument. However, it can also be arranged that all display elements to the left or to the right of the display element indicating the instantaneous measuring value, also have an appearance differing from the surrounding. In that case, one obtaines a presentation corresponding to the mercury column of a mercury thermometer, in which the transition between the display elements which do and do not deviate from the surrounding, indicates the measuring value.

A measuring instrument of the type described is a favourable combination of digital and analogous presentation. With the exception of the numeral of the lowest order of the instantaneous measuring value, all numerals of the measuring value are presented directly and digitally, so that they can be read at a glance. The numeral of the lowest order but one of the instantaneous measuring value is not only presented digitally, but also analogously (since the location where that numeral is displayed depends upon the value of that numeral). The numeral of lowest order of the measuring value is displayed exclusively in an analogous way.

If the measuring value fluctuates, the display elements 1, 2 and 3 which deviate from the surrounding change correspondingly. Each of them therefore deviates from the surrounding only during part of the time, and the range within which the measuring value fluctuates can thereby be observed, with or without flicker, dependent upon the fluctuation frequency. Because of the inertia-free presentation, this is true even for high fluctuation frequencies.

A measuring instrument of the type referred to is excellently suitable for signalling limit values. For that purpose, a rail or slot 8 can be provided alongside the scale, along which two or more tabs 9 can move. Each of these tabs carries a light sensitive element (e.g. a photodiode) which provides a limit value signal as soon as the underlying display element 1, 2 or 3 assumes an appearance deviating from the surrounding. This can be done very easily if the display elements 1, 2 and 3 light up in that they are provided with light emitting diodes, gas discharge lamps or incandescent lamps, but is also possible if the display elements 1, 2 and 3 have an optical transmission coefficient or reflection coefficient dependent upon the control, such as when using liquid crystals, provided that sufficient ambient light is available, or a light source is available.

What is claimed is:

1. Displaying measuring instrument in which a measured value of a quantity is displayed by a selective change of illumination state of predetermined visual display elements arranged in a display panel, comprising a plurality of discrete display elements, each element having more than one illumination state and each element adapted to change its illumination state to illuminate from within said element upon energization, at least some of which display elements of the display panel being arranged in a straight line, each of which said display elements arranged in a straight line representing a uniform, discrete measured quantity from the next nearest display element in the straight line, and means successively changing the illumination state of said display elements to correspond to a new measured value when said measured value is changed to said new measured value, wherein each of said visual display elements comprises a shape selected from one of a first shape and a second shape, wherein said first shape is distinguishably different from said second shape, and wherein the display elements arranged in a straight line, periodic ones of said display elements comprise said second shape, and all other of said display elements comprise said first shape, said visual display elements comprised of said second shape being further comprised of an alphanumeric indication arranged in a closed border around said alphanumeric indication, the alphanumeric indication and the closed border changing its illumination state upon energization, said measuring instrument further comprising at least one tab supported in close proximity to said straight line of visual display elements on said display panel, and moveable linearly along said straight line so as to be in close proximity to said visual display elements, each tab comprising a light-sensitive element adapted to provide a signal when the visual display element nearest to said tab is energized and is illuminated from within.

2. Measuring instrument according to claim 1 wherein said visual display elements arranged in a straight line comprise the least significant digit indication of said display panel, said measuring instrument further comprising at least a next least significant digit alphanumeric indicator connected to display an alphanumeric indication in response to said measured value of a quantity.

3. The measuring instrument of claim 2 wherein said alphanumeric indicator comprises means to indicate the polarity of the measured value being displayed.

* * * * *